United States Patent [19]

Sakaya et al.

[11] Patent Number: 5,180,273
[45] Date of Patent: Jan. 19, 1993

[54] APPARATUS FOR TRANSFERRING SEMICONDUCTOR WAFERS

[75] Inventors: Kazuhiro Sakaya, Yokohama; Shoichi Kodama, Tokyo, both of Japan

[73] Assignee: Kabushiki Kaisha Toshiba, Kawasaki, Japan

[21] Appl. No.: 593,963

[22] Filed: Oct. 9, 1990

[30] Foreign Application Priority Data

Oct. 9, 1989 [JP] Japan ................. 1-263444

[51] Int. Cl.$^5$ ............................................. B65G 69/00
[52] U.S. Cl. ..................................... 414/404; 414/156; 414/173; 414/417; 414/DIG. 4; 414/DIG. 6; 432/241
[58] Field of Search ................. 414/150, 152, 156–158, 414/160, 172, 173, 196, 198, 403, 404, 417, DIG. 4, DIG. 6; 432/6, 241

[56] References Cited

U.S. PATENT DOCUMENTS

| Re. 33,341 | 9/1990 | Lee et al. | 414/404 |
|---|---|---|---|
| 4,603,897 | 8/1986 | Foulke et al. | 414/404 X |
| 4,611,966 | 9/1986 | Johnson | 414/404 |
| 4,770,590 | 9/1988 | Hugues et al. | 414/172 |
| 4,778,382 | 10/1988 | Sakashita | 414/156 X |
| 4,938,691 | 7/1990 | Ohkase et al. | 414/172 X |
| 4,955,775 | 9/1990 | Ohkase et al. | 414/172 X |
| 4,981,436 | 1/1991 | Watanabe | 432/241 |
| 5,028,195 | 7/1991 | Ishii et al. | 414/172 X |
| 5,048,164 | 9/1991 | Harima | 414/404 X |
| 5,054,988 | 10/1991 | Shiraiwa | 414/404 |

FOREIGN PATENT DOCUMENTS

| 258459 | 12/1985 | Japan | 414/156 |
|---|---|---|---|
| 4142 | 1/1987 | Japan | 414/417 |
| 63-244856 | 10/1988 | Japan | |

Primary Examiner—David A. Bucci
Attorney, Agent, or Firm—Foley & Lardner

[57] ABSTRACT

An apparatus for transferring a predetermined number of semiconductor wafers to a wafer boat charging/discharging unit or to one of an array of vertical type dispersing furnaces via the wafer boat charging/discharging unit. The apparatus is operated by actuating the wafer boat charging/discharging unit adapted to charge a wafer boat having a mass of semiconductor wafers carried thereon in a vertical state in a furnace tube of the dispersing furnace by using a vertically displaceable wafer boat stage on which the wafer boat is charged in a furnace tube in cooperation with a wafer boat handler. After completion of a dispersing operation, the wafer boat is lowered away from the furnace tube and then returned to a wafer boat transferring passage with the aid of the wafer boat handler. The apparatus includes as essential components a wafer carrier holding section having a plurality of wafer carriers carried thereon, a turn head for displacing one of the wafer carriers via turning movement by an angle of 180 degrees, an attitude changing mechanism for turning a wafer boat having a mass of semiconductor wafers received therein from a horizontal position to a vertical position by an angle of 90 degrees and a wafer boat transferring section extending in front of the array of vertical type dispersing furnaces.

24 Claims, 4 Drawing Sheets

APPARATUS FOR TRANSFERRING SEMICONDUCTOR WAFERS

BACKGROUND OF THE INVENTION

1. Field of the Invention

The present invention relates generally to an apparatus for transferring a number of semiconductor wafers. More particularly, the present invention relates to an apparatus for transferring a number of semiconductor wafers to a furnace tube in one of a plurality of vertical type dispersing furnaces via a wafer boat charging/discharging unit.

2. Description of the Related Art

In general, a variety of semiconductor elements are produced by way of a large number of processing steps. One of the processing steps is a step of allowing a number of semiconductor wafers to be subjected to dispersing.

Figure 8:
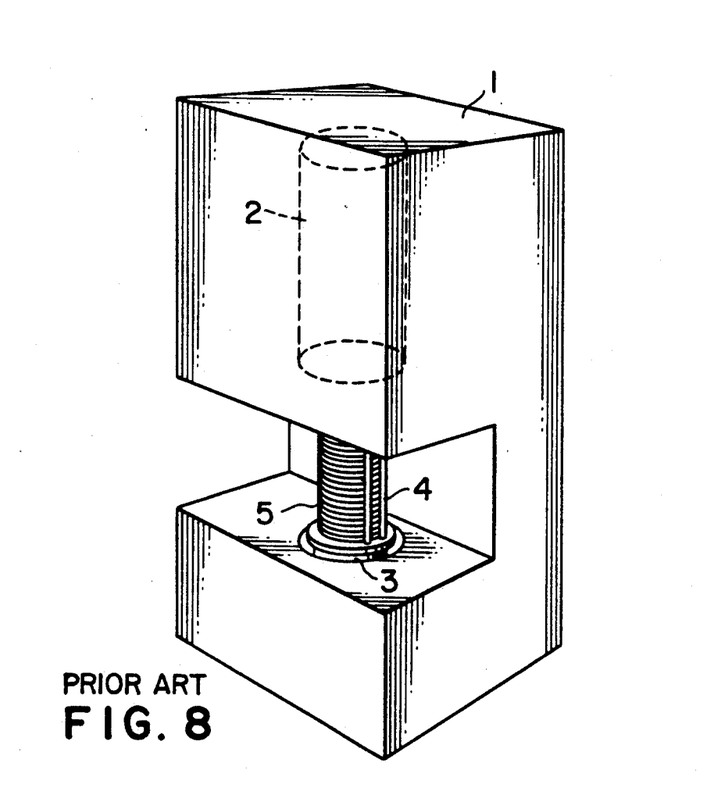
FIG. 8 is a perspective view which illustrates a conventional vertical type dispersion furnace.

FIG. 8 is a perspective view which illustrates a conventional vertical type dispersing furnace including a furnace tube in which a dispersing step is to be performed. In the drawing, the vertical type dispersing furnace is represented by reference numeral 1. A furnace tube 2 is accommodated in the upper part of the dispersing furnace 1, and a vertically displaceable wafer boat stage 3 is disposed below the furnace tube 2 to elevate and lower a mass of semiconductor wafers. A wafer boat 4 is placed on the wafer boat stage 3 in an upright standing state, and a number of semiconductor wafers 5 are received in the wafer boat 4 in a laminated structure in a parallel relationship relative to each other. Thus, the respective semiconductor wafers 5 are held in a horizontal attitude when the wafer boat 4 stands upright as shown in the drawing.

In operation, after a predetermined number of semiconductor wafers 5 are received in the wafer boat 4 by manually handling a pincette or the like tool, the wafer boat stage 3 is elevated so as to allow the wafer boat 4 to be charged in the furnace tube 2. While the foregoing state is maintained, the respective semiconductor wafers 5 are subjected to dispersing in the furnace tube 2. Thereafter, the wafer boat stage 3 is lowered so that the semiconductor wafers 5 which have been subjected to dispersing are taken out from the wafer boat 4 by manually handling the pincette or the like tool.

With the conventional vertical type dispersing furnace 1 as constructed in the above-described manner, however, it has been found that there arise such problems that the semiconductor wafers 5 are undesirably injured or damaged when they are manually handled by the pincette or the like tool, and moreover, fine dust or other foreign material becomes adhesively attached to the semiconductor 5.

In addition, since the semiconductors 5 are manually charged in and discharged from the wafer boat 4, and since the wafer boat 4 is likewise manually mounted on and dismounted from the wafer boat stage 3, an operator is required to conduct his work using much care, such that the operational efficiency is remarkably being reduced. These problems become more and more serious as the respective semiconductor wafers 5 are dimensioned to have a larger diameter.

SUMMARY OF THE INVENTION

The present invention has been made with the foregoing background in mind.

An object of the present invention is to provide an apparatus for transferring a number of semiconductor wafers wherein charging of the semiconductor wafers in, and discharging the semiconductor wafers from a wafer boat, as well as transference of the wafer boat itself, are achieved in an automatic manner.

Another object of the present invention is to provide an apparatus for transferring a number of semiconductor wafers wherein transference of the semiconductor wafers is achieved at a high operational efficiency.

To accomplish the above objects, there is provided according to one aspect of the present invention an apparatus for transferring a number of semiconductor wafers to a wafer boat charging/discharging unit adapted to charge a wafer boat having a mass of transferred semiconductor wafers carried thereon in a vertical state in a furnace tube of one of an array of vertical type dispersing furnaces in cooperation with a wafer boat handler and discharge it therefrom after completion of a dispersing operation by lowering a wafer boat stage on which the wafer boat is charged in the furnace tube, wherein the apparatus comprises a wafer carrier holding section on which a plurality of wafer carriers each having a predetermined number of semiconductor wafers carried in a vertical state in a side-by-side relationship are held, wafer carrier displacing means for displacing one of the wafer carriers on the wafer carrier holding section to an empty wafer boat held on attitude changing means in a horizontal state via turning movement, the attitude changing means being raised up from the horizontal state to a vertical state with a predetermined number of semiconductor wafers received in the empty wafer boat via turning movement, and wafer boat transferring means for transferring the wafer boat having a mass of semiconductor wafers received therein to the position in front of one of the array of vertical type dispersing furnaces.

Further, according to another aspect of the present invention, there is provided an apparatus for transferring a number of semiconductor wafers to one of an array of vertical type dispersing furnaces by actuating a wafer boat charging/discharging unit adapted to charge a wafer boat having a mass of transferred semiconductor wafers carried thereon in a vertical state in a furnace tube of the vertical type dispersing furnace in cooperation with a wafer boat handler and discharge it therefrom after completion of a dispersing operation by lowering a wafer boat stage on which the wafer boat is charged in the furnace tube, wherein the apparatus comprises a wafer carrier holding section on which a plurality of wafer carriers each having a predetermined number of semiconductor wafers carried in a vertical state in a side-by-side relationship are held, wafer carrier displacing means for displacing one of the wafer carriers on the wafer carrier holding section to an empty wafer boat held on attitude changing means in a horizontal state via turning movement, the attitude changing means being raised up from the horizontal state to a vertical state with a predetermined number of semiconductor wafers received in the empty wafer carrier via turning movement, and wafer boat transferring means for transferring the wafer boat having a mass of semiconductor wafers received therein to the position in front of one of the vertical type dispersing furnaces.

The wafer carriers in the wafer carrier holding section are arranged side by side in parallel with the empty wafer boat on the attitude changing means.

The wafer carrier displacing means is composed of a turn head and a vertically displaceable column member. The turn head comprises an inverted U-shaped frame and a turn arm turnably held on the column member. The column member is adapted to move in parallel with an array of wafer carriers in the wafer holding section thereby to positionally coincide with one of the wafer carriers from which a mass of semiconductor wafers is to be displaced.

To turnably displace one of the wafer carriers to the attitude changing means, the wafer carrier displacing means further includes a rotational shaft to turnably hold the turn arm by a pair of bearings on the column member. It is desirable that the rotational shaft is operatively connected to a pulse motor via a coupling.

To assure that a mass of semiconductor wafers received in one wafer carrier is introduced into the turn head, a first pusher is arranged at the position corresponding to a certain wafer carrier in the wafer carrier holding section.

Further, to assure that a mass of semiconductor wafers held in the turn head is received in the empty wafer boat on the attitude changing means, a second pusher is arranged at the corresponding position in the attitude changing means.

To reliably hold the mass of semiconductor wafers in the turn head, the turn head is provided with a wafer stopper, and when the wafer stopper is protruded in the interior of the turn head, it prevents the mass of semiconductor wafers from falling down in the interior of the wafer carrier holding section. When the wafer stopper is retracted from the turn head on the attitude changing means, it permits the mass of semiconductor wafers to be received in the empty wafer boat.

It is desirable that the attitude changing means is composed of an U-shaped frame in which an empty wafer boat is received, turning means for turning the wafer boat having a predetermined of semiconductor wafers received therein from the horizontal state to the vertical state and vice versa and a cylinder unit serving as a retainer for firmly holding the wafer boat in the U-shaped frame. For example, the turning means comprises a sector gear fixedly secured to the U-shaped frame and a pinion meshing with the sector gear.

It is desirable that the wafer boat transferring means is composed of a wafer boat transfer stage on which the wafer boat having a mass of semiconductor wafers carried thereon stands upright, a carrier on which the transfer stage is fixedly mounted to reciprocably move along a linear guide in front of the array of vertical type dispersing furnaces, and a belt extending round a pair of pulleys. Opposite ends of the belt are fixedly secured to the carrier which in turn is reciprocably driven by rotating one of the pulleys.

With the apparatus as constructed in the above-described manner, a mass of semiconductor wafers in each wafer carrier is automatically displaced to an empty wafer boat on the attitude changing means via turning movement and then the wafer boat having a predetermined number of semiconductor wafers carried thereon is automatically transferred to the wafer boat charging/discharging unit. After completion of dispersing operation, the mass of semiconductor wafers which has been subjected to dispersing in the corresponding vertical type dispersing furnace is automatically returned to the wafer carrier holding section via the attitude changing means in accordance with the reverse order.

Since all operations of the apparatus are automatically performed, the apparatus of the present invention guarantees a substantially improved operational efficiency without any possibility that the respective semiconductor wafers are injured or damaged by manual handling and fine dust or the like foreign material is adhesively attached to them.

Other objects, features and advantages will become apparent from reading of the following description which has been described in conjunction with the accompanying drawings.

BRIEF DESCRIPTION OF THE DRAWINGS

The present invention is illustrated in the following drawings in which.

DESCRIPTION OF THE PREFERRED EMBODIMENT

The present invention will be described in detail hereinafter with reference to the accompanying drawings which illustrate a preferred embodiment of the present invention.

Figure 1:
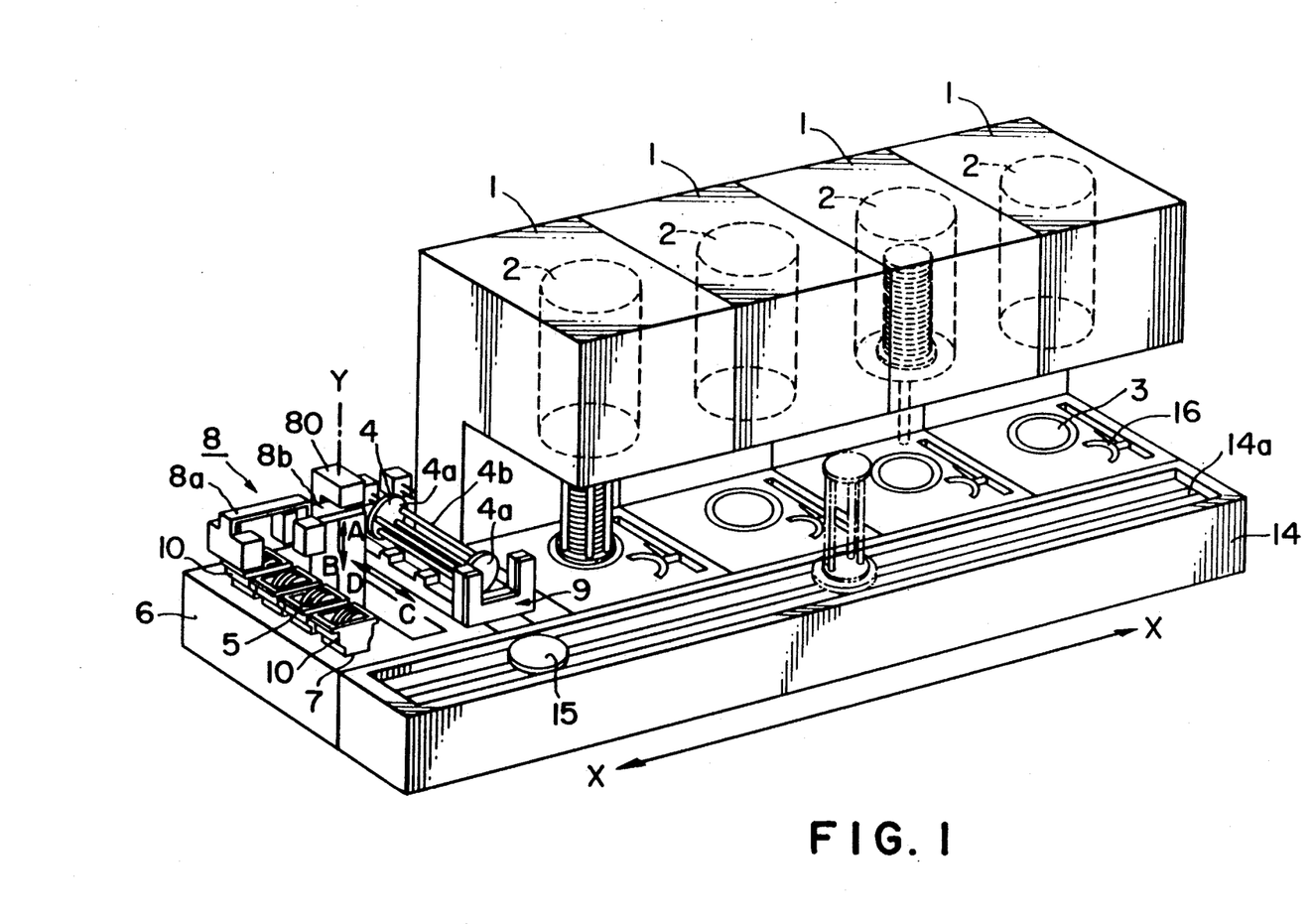
FIG. 1 is a perspective view which illustrates an apparatus for transferring a number of semiconductor wafers in accordance with an embodiment of the present invention.

FIG. 1 is a perspective view which illustrates an apparatus for transferring a number of semiconductor wafers in accordance with the embodiment of the present invention.

As is apparent from the drawing, a plurality of vertical type dispersing furnaces 1 (four dispersing furnaces in the illustrated embodiment) are arranged side by side on the common plane to that of a boat table 6, and a furnace tube 2 is accommodated in each dispersing furnace 1. In addition, a wafer boat stage 3 is arranged below the corresponding dispersing furnace 1 so as to elevate or lower a wafer boat 4 by actuating a known mechanism (of which structure and operation are not herein described for the purpose of simplification). The boat table 6 is installed adjacent to an array of vertical type dispersion furnaces 1 on the common plane at the left-hand end part of the apparatus so that a wafer carrier holding section 7, a turn head 8 and an attitude changing mechanism 9 are mounted on the boat table 6. The wafer carrier holding section 7 holds a plurality of wafer carriers 10 (four wafer carriers in the illustrated embodiment), and a predetermined number of semiconductor wafers 5 (25 sheets of semiconductor wafers in the illustrated embodiment are vertically received in a side-by-side relationship in each wafer carrier 10 so that a dispersing operation is performed for a mass of semiconductor wafers (100 sheets of semiconductor wafers in the illustrated embodiment) in each vertical type dispersing furnace 1.

Figure 2A:
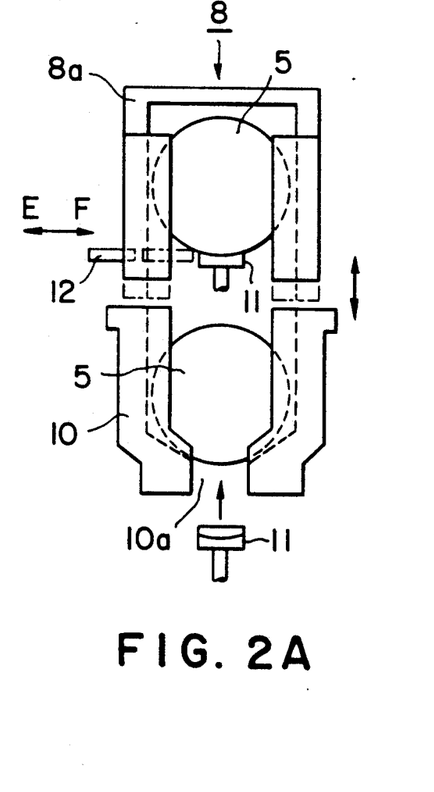
FIG. 2(A) is a front view which illustrates that a mass of semiconductor wafers in a wafer carrier is elevated by actuating a first pusher so as to allow it to be introduced into the inverted U-shaped frame of a turn head.

As shown in FIG. 2(A), a first wafer pusher 11 is disposed below each wafer carrier 10 so as to elevate one lot of semiconductor wafers 5, i.e., 25 sheets of semiconductor wafers 5. When the wafer pusher 11 is actuated, it is upwardly displaced through an opening 10a so that the semiconductor wafers 5 received in the wafer carrier 10 are introduced into the interior of the turn head 8.

As is apparent from the drawings, the turn head 8 is composed of an inverted U-shaped frame 8a and a turn arm 8b, and a raising/lowering column 80 having a rectangular cross-sectional shape and adapted to be displaced in the vertical direction as well as in the forward/rearward direction (in the C - D direction). Column 80 stands upright on the wafer table 6 so as to allow the transfer head 8 to be displaced in the vertical direction (in the A - B direction) as well as in the forward/rearward direction (in the C - D direction). In addition, the turn head 8 is constructed such that it turns about a center axis Y - Y by an angle of 180 degrees in a horizontal plane between the position above the wafer carrier holding section 7 and the position above the attitude changing mechanism 9.

Figure 3:
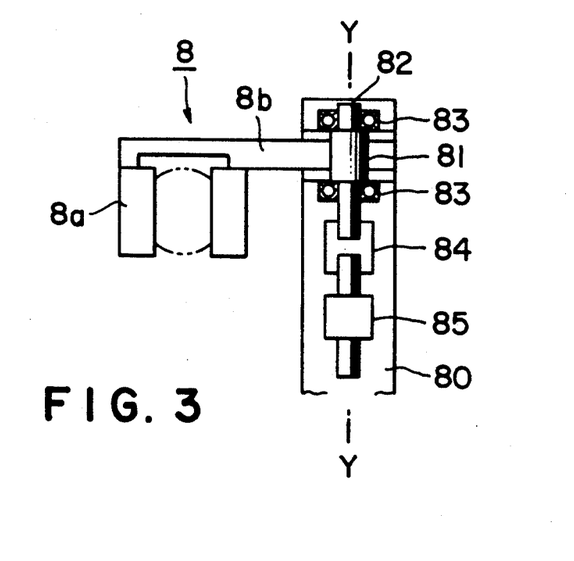
FIG. 3 is a schematic front view which illustrates the structure of a mechanism for turning the turn head in a horizontal plane.

FIG. 3 is a schematic view which illustrates a mechanism for rotating the turn head 8. As shown in the drawing, the turn arm 8b is fixedly connected to a rotational shaft 81 which is rotatably supported by a pair of bearings 82 and 83. The lower end of the rotational shaft 81 is operatively connected to a pulse motor 85 via a coupling 84. Thus, as the pulse motor 85 is driven, the turn head 8 is rotated in the horizontal plane by an angle of 180 degrees.

As shown in FIG. 2A, the turn head 8 includes a wafer stopper 12 adapted to be displaced in the forward/rearward direction, i.e., in the E - F direction. The wafer stopper 12 serves to hold the semiconductor wafers 5 for preventing them from falling down after they are introduced into the interior of the turn head 8.

Figure 4:
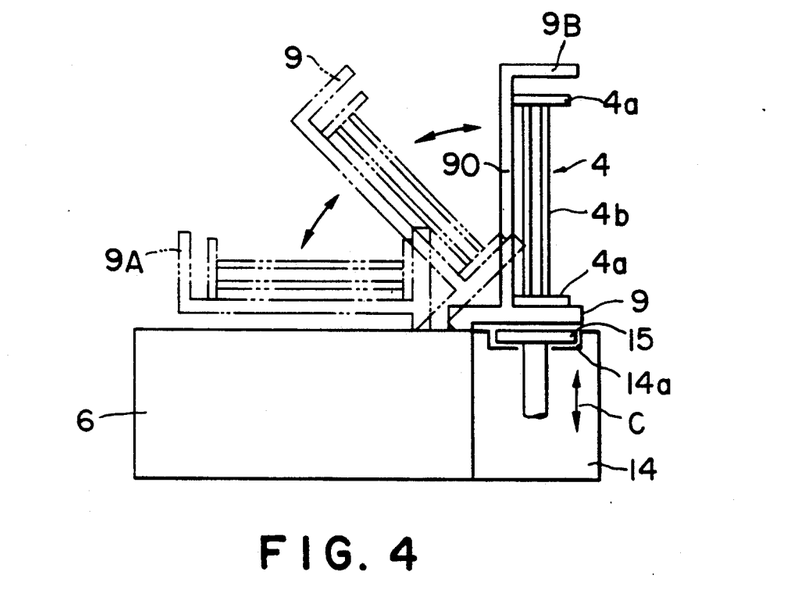
FIG. 4 is a schematic side view which illustrates an attitude changing mechanism wherein solid lines represent that a wafer boat stands upright and two-dot chain lines represent that the wafer boat is laid down on the attitude changing mechanism to assume a horizontal attitude via an intermediate inclined state.

As is apparent from FIG. 1 and FIG. 4, the attitude changing mechanism 9 includes an U-shaped frame 90 in which the wafer boat 4 is successively received. In addition, the attitude changing mechanism 9 is constructed such that the frame 90 is turned between the laid position, i.e., the horizontal attitude and the upright standing position, i.e., the vertical attitude by an angle of 90 degrees.

Figure 5:
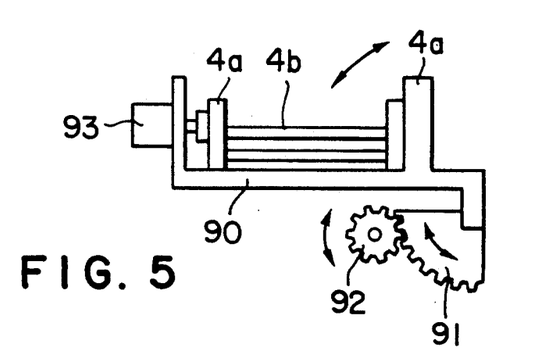
FIG. 5 is a schematic view which illustrates the structure of a mechanism for turning the wafer boat from the horizontal attitude to the upright attitude and vice versa.

Specifically, as shown in FIG. 5, the attitude changing mechanism 9 includes the U-shaped frame 90 which has a sector gear 91 secured thereto at the base part, and a pinion gear 92 is brought in meshing engagement with the sector gear 91. Additionally, the frame 90 is provided with a cylinder unit 93 at its free end to serve as a retainer for the wafer boat 4.

With such construction as mentioned above, while the attitude changing mechanism 9 is laid down in the horizontal plane as represented by two-dot chain lines 9A in FIG. 4, the wafer boat 4 is supported in the horizontal state. On the other hand, when the attitude changing mechanism 9 is turned to stand upright on the boat table 6 as represented by solid lines 9B in FIG. 4, the wafer boat 4 is supported in the vertical state.

Figure 2B:
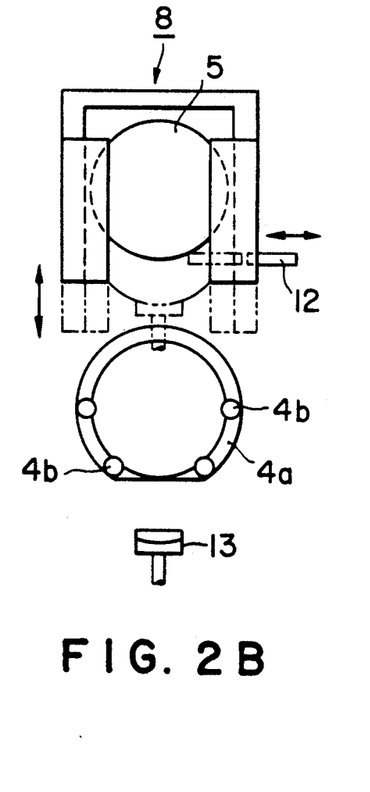
FIG. 2(B) is a front view which illustrates that the mass of semiconductor wafers held in the turn head is lowered on an empty wafer boat by actuating a second pusher.

To assure that the mass of semiconductor wafers 5 received in the turn head 8 is lowered in the wafer boat 4, a second wafer pusher 13, having the same structure as that of the first wafer pusher 11, as shown in FIG. 2B, is arranged below the attitude changing mechanism 9 which has been held in the horizontal state as represented by reference numeral 9A in FIG. 4.

As shown in FIG. 1, FIG. 2B and FIG. 4, the wafer boat 4 is composed of circular plates 4a at opposite ends thereof and a plurality of support rods 4b extending between the both circular plates 4a so that the mass of semiconductor wafers 5 is received in the hollow space defined by the circular plates 4a and the support rods 4b every time the second wafer pusher 13 is downwardly actuated to lower the mass of semiconductor wafers 5 from the interior of the turn head 8.

A wafer boat transferring section 14 extends in the horizontal direction along the fore end part of the boat table 6, and the fore end parts of the respective dispersing furnaces 1. A transferring passage 14a in the shape of a longitudinally extending groove is formed on the wafer boat transferring section 14, and a wafer boat transfer stage 15, adapted to move in the X - X direction, is received in the transferring passage 14a.

Figure 6:
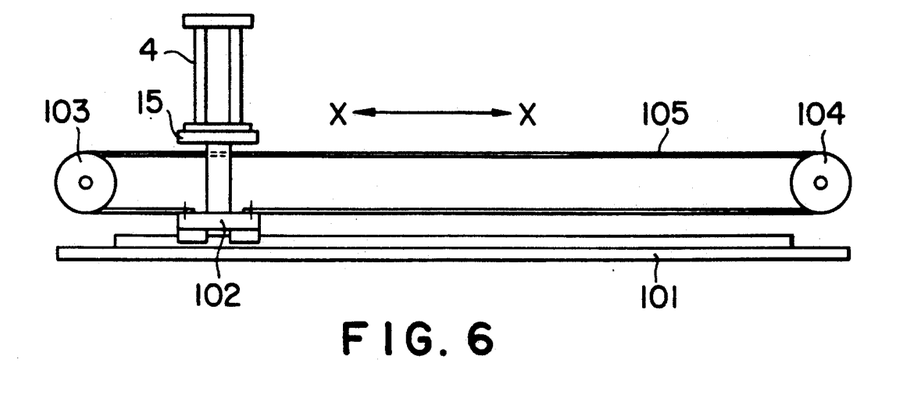
FIG. 6 is a schematic view which illustrates that the wafer boat is displaced from the left-hand end to the right-hand end and vice versa by rotating one of pulleys.

As is apparent from FIG. 6, the transfer stage 15 is fixedly mounted on a carrier 102 adapted to move along a linear guide 101 in a reciprocating manner.

Opposite ends of a belt 105 extending round a pair of pulleys 103 and 104 are fixed to the carrier 102 so that the transfer stage 15 is transferred to a position in front of each furnace tube 2 in each dispersing furnace 1, as one of the pulleys 103 and 104 is driven.

Figure 7:
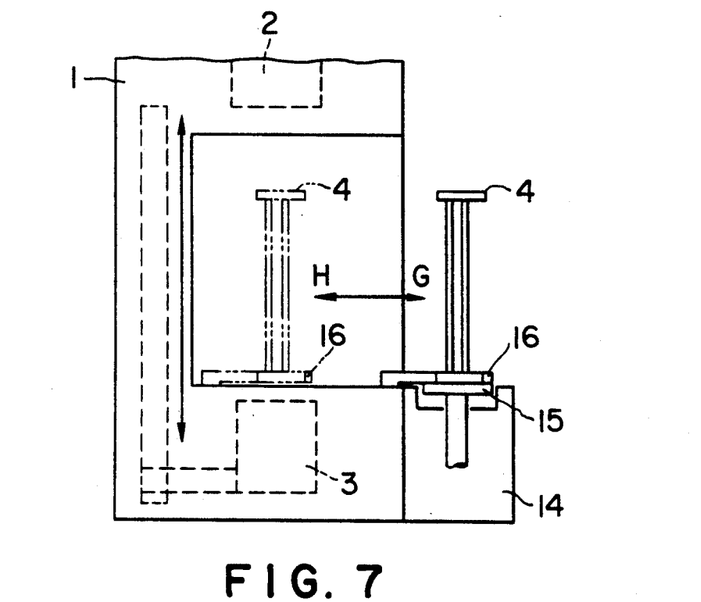
FIG. 7 is a schematic view which illustrates a wafer boat charging/discharging unit.

On the other hand, the dispersing furnace 1 is provided with a wafer boat handler 16 adapted to move in the forward/rearward direction, i.e., in the G - H direction in FIG. 7 such that the wafer boat 4, on the transferring stage 15, is transferred onto a wafer boat stage 3 while it is held by the wafer boat handler 16.

Next, operation of the apparatus as constructed in the above-described manner will be described below.

Referring to FIG. 1, four wafer carriers 10 each containing a plurality of semiconductor wafers 5 by a quantity of unit lot, i.e., 25 sheets of semiconductor wafers 5, are held on the wafer carrier holding section 7 while the respective semiconductor wafers 5 are received in the wafer boat 4 in a side-by-side relationship.

In the meantime, another empty wafer boat 4 is received in the attitude changing mechanism 9 in the horizontal state. After the frame 8a of the turn head 8 is lowered on one wafer carrier 10 with the wafer stopper 12 retracted outwardly, the first wafer pusher 11 is elevated so that a mass of semiconductor wafers 5 in the wafer carrier 10 are introduced into the frame 8a. Subsequently, the wafer stopper 12 is protruded forwardly to come in contact with the lower end of the mass of semiconductor wafers 5, whereby the respective semiconductor wafers 5 are held in the frame 8a. Then, the first wafer pusher 11 is lowered and the turn head 8 is elevated to turn in the horizontal plane by an angle of 180 degrees until it reaches the position directly above the empty wafer boat 4 which has been received in the attitude changing mechanism 9 (see FIG. 2B). Subsequently, when the turn head 8 is lowered on the empty wafer boat 4, the second wafer pusher 13 is actuated to move upwardly through the hollow space between the two support rods 4b of the empty wafer boat 4, whereby the respective semiconductor wafers 5 in the frame 8a of the turn head 8 are supported by the second wafer pusher 13. Thereafter, when the wafer stopper 12 is retracted and the second pusher 13 is lowered, the mass of semiconductor wafers 5 is received in the wafer boat 4. In such a manner as mentioned above, all the semiconductor wafers 5 in the three residual wafer carriers 10 are transferred into the wafer boat 4 by repeatedly performing the aforementioned operations for the three residual wafer carriers 10.

Subsequently, as shown in FIG. 4, the attitude changing mechanism 9 is turned from the horizontal position 9A to the vertical position 9B thereby holding the wafer boat 4 on the transference stage 15 in the vertical state. After the mass of the semiconductor wafers 5 is placed on the transference stage 15, the attitude changing mechanism 9 is turned again to the original position, i.e., the horizontal position 9A.

Next, as shown in FIG. 7, after the transference stage is displaced along the transference passage 14a to reach position in front of a predetermined dispersing furnace 1, the wafer boat handler 16 is displaced forwardly to the position directly below the wafer boat 4 so as to allow the wafer boat 4 on the transfer stage 15 to be placed on the wafer boat handler 16. On completion of the receiving operation of the wafer boat 4 with the mass of semiconductor wafers 5 carried thereon, the wafer boat handler 16 is retracted so as to allow the wafer boat 4 to be placed on a wafer boat stage 3.

Subsequently, the wafer boat stage 3 is elevated so that the wafer boat 4 is charged in the furnace tube 2 in which the mass of semiconductor wafers 5 is subjected to dispersing for a predetermined period of time.

After completion of the dispersing operation, the mass of semiconductor wafers 5, which has been subjected to dispersing, is returned to the corresponding wafer carrier 10 in the wafer carrier holding section 7 in accordance with the reverse order of that described above.

While the present invention has been described above with respect to a single preferred embodiment, it should of course be understood that the present invention should not be limited only to this embodiment but is considered to cover various changes or modifications which may be made to the invention without departing from the scope and spirit of the invention as defined by the appended claims. For example, according to the aforementioned embodiment, after the mass of semiconductor wafers 5 has been subjected to dispersing, it is returned to the corresponding wafer carrier 10, in the wafer carrier holding section 7, via the transference passage 14a. Alternatively, the mass of semiconductor wafers 5, which has been subjected to dispersing, may be returned to the corresponding wafer carrier 10 on the wafer carrier holding section 7 via another passage or route.

What is claimed is:

1. An apparatus for transferring a plurality of semiconductor wafers to a wafer boat charging/discharging unit adapted to charge the plurality of semiconductor wafers in a vertical position in a furnace tube of one of an array of vertical type dispersing furnaces, and to discharge the plurality of semiconductor wafers therefrom after the completion of a dispersing operation of the furnace tube, said apparatus comprising:

a wafer carrier holding section;

a plurality of wafer carriers each being disposed on said wafer carrier holding section and each carrying a predetermined number of semiconductor wafers, said predetermined number of semiconductor wafers being vertically aligned in a side-by-side relationship to each other;

a wafer boat having a bottom portion;

a wafer boat transfer means, having a wafer boat stage, for transferring said wafer boat;

a wafer displacer, having a vertically adjustable column and a turn head which is connected to said column and rotatable in a horizontal plane relative to said column, for displacing said predetermined number of semiconductor wafers from one of said wafer carriers into said wafer boat when said wafer boat is in a horizontal state; and attitude changing means for holding said wafer boat and for raising said wafer boat between said horizontal state and a vertical state, wherein said attitude changing means is oriented in a horizontal position and is perpendicular to said wafer boat transfer stage when said wafer boat is in said horizontal state, and when said attitude changing means raises said wafer boat to said vertical state, said bottom portion of said wafer boat is positioned just above said transfer stage such that said wafer boat can be vertically transferred from said attitude changing means to said transfer stage;

wherein said wafer boat transfer stage includes means for transferring said wafer boat from said attitude changing means and carrying said wafer boat on a top portion thereof to a position in front of one of said array of vertical type dispersing furnaces.

2. The apparatus as claimed in claim 1, wherein said turn head comprises an inverted U-shaped frame and a turn arm rotatably held on said column, said column being adapted to move in parallel with the plurality of wafer carriers in the wafer carrier holding section, thereby allowing said turn head to positionally coincide with one of the wafer carriers from which said predetermined number of semiconductor wafers is to be displaced.

3. The apparatus as claimed in claim 2, wherein said wafer carrier displacer further includes a rotational shaft, connected to said turn arm, to rotatably hold said turn arm by a pair of bearings mounted on said column, a pulse motor, and a coupling, wherein said rotational shaft is operatively connected to said pulse motor via said coupling.

4. The apparatus as claimed in claim 2, wherein a plurality of second pushers are arranged, at said attitude changing means, each of said second pushers corresponding to one of said wafer carriers in said wafer carrier holding section, so as to allow said predetermined number of semiconductor wafers in said frame to be received in said wafer boat by downwardly actuating the corresponding second pusher.

5. The apparatus as claimed in claim 2, wherein said turn head is provided with a wafer stopper for preventing the predetermined number of semiconductor wafers in the frame from falling down when said wafer stopper is protruded into the interior of the frame.

6. The apparatus as claimed in claim 5, wherein said wafer stopper is slidable and permits the predetermined number of semiconductor wafers to be received in said wafer boat when said wafer stopper is retracted from the interior of the frame.

7. An apparatus as claimed in claim 6, wherein said stopper slides in a direction parallel to said predetermined number of semiconductor wafers.

8. The apparatus as claimed in claim 2, wherein the wafer carrier displacer is turnable between the wafer carrier holding section and the attitude changing means by an angle of 180 degrees.

9. The apparatus as claimed in claim 2, wherein a plurality of first pushers are arranged, at said wafer carrier holding section, each of said first pushers corresponding to one of said wafer carriers, so as to allow said predetermined number of semiconductor wafers in one of said wafer carriers to be introduced into the interior of said frame by upwardly actuating the corresponding first pusher.

10. The apparatus as claimed in claim 1, wherein said attitude changing means comprises a U-shaped frame in which the wafer boat is held, turning means for turning the wafer boat between the horizontal state and the vertical state by an angle of 90 degrees, and a cylinder unit serving as a retainer for firmly holding the wafer boat in said U-shaped frame.

11. The apparatus as claimed in claim 10, wherein said turning means comprises a sector gear fixedly secured to the U-shaped frame and a pinion meshing with said sector gear.

12. The apparatus as claimed in claim 1, wherein said wafer boat transferring means further comprises a carrier on which said transfer stage is fixedly mounted, a linear guide disposed in front of said array of vertical type dispersing furnaces, and a belt extending around a pair of pulleys, opposite ends of said belt being fixed to said carrier, and said belt being reciprocably driven by one of said pulleys such that said transfer stage reciprocatingly moves along said linear guide.

13. An apparatus for transferring a plurality of semiconductor wafers to a wafer boat charging/discharging unit adapted to charge the plurality of semiconductor wafers in a vertical position in a furnace tube of one of an array of vertical type dispersing furnaces, and to discharge the plurality of semiconductor wafers therefrom after the completion of a dispersing operation of the furnace tube, said apparatus comprising:

a wafer carrier holding section;

a plurality of wafer carriers each being disposed on said wafer carrier holding section and each carrying a predetermined number of semiconductor wafers, said predetermined number of semiconductor wafers being vertically aligned in a side-by-side relationship to each other;

a wafer boat having a bottom portion;

a wafer boat transfer means, having a wafer boat stage, for transferring said wafer boat;

a wafer displacer for displacing said predetermined number of semiconductor wafers from one of said wafer carriers into said wafer boat when said wafer boat is in a horizontal state;

attitude changing means for holding said wafer boat and for raising said wafer boat between said horizontal state and a vertical state, wherein said attitude changing means is oriented in a horizontal position and is perpendicular to said wafer boat transfer stage when said wafer boat is in said horizontal state, and when said attitude changing means raises said wafer boat to said vertical state, said bottom portion of said wafer boat is positioned just above said transfer stage such that said wafer boat can be vertically transferred from said attitude changing means to said transfer stage;

wherein said wafer boat transfer stage includes means for transferring said wafer boat from said attitude changing means and carrying said wafer boat on a top portion thereof to a position in front of one of said array of vertical type dispersing furnaces.

14. The apparatus as claimed in claim 13, wherein said wafer carrier displacer comprises a turn head and a vertically displaceable column, said turn head comprising an inverted U-shaped frame and a turn arm turnably held on said column, said column being adapted to move in parallel with the wafer carriers in the wafer carrier holding section, thereby allowing said turn head to positionally coincide with one of the wafer carriers from which said predetermined number of semiconductor wafers is to be displaced.

15. The apparatus as claimed in claim 14, wherein a plurality of first pushers are arranged at said wafer carrier holding section, each of said first pushers corresponding to one of said wafer carriers, so as to allow said predetermined number of semiconductor wafers in one of said wafer carriers to be introduced into the interior of said frame by upwardly actuating the corresponding first pusher.

16. The apparatus as claimed in claim 14, wherein a plurality of second pushers are arranged at said attitude changing means, each of said second pushers corresponding to one of said wafer carriers in said wafer carrier holding section so as to allow said predetermined number of semiconductor wafers in said frame to be received in said wafer boat by downwardly actuating the corresponding second pusher.

17. The apparatus as claimed in claim 14, wherein said wafer carrier displacer further includes a rotational shaft, connected to said turn arm, to rotatably hold said turn arm by a pair of bearings mounted on said column, a pulse motor, and a coupling, wherein said rotational shaft is operatively connected to said pulse motor via said coupling.

18. The apparatus as claimed in claim 14, wherein said turn head is provided with a wafer stopper for preventing the predetermined number of semiconductor wafers in the frame from falling down when said wafer stopper is protruded into the interior of the frame.

19. The apparatus as claimed in claim 18, wherein said wafer stopper is slidable and permits the predetermined number of semiconductor wafers to be received in said wafer boat when it is retracted from the interior of the frame.

20. An apparatus as claimed in claim 19, wherein said stopper slides in a direction parallel to said predetermined number of semiconductor wafers.

21. The apparatus as claimed in claim 14, wherein the wafer carrier displacer is turnable between the wafer carrier holding section and the attitude changing means by an angle of 180 degrees.

22. The apparatus as claimed in claim 13, wherein said attitude changing means comprises a U-shaped frame in which the wafer boat is held, turning means for turning the wafer boat between the horizontal state and the vertical state by an angle of 90 degrees, and a cylinder unit serving as a retainer for firmly holding the wafer boat in said U-shaped frame.

23. The apparatus as claimed in claim 22, wherein said turning means comprises a sector gear fixedly secured to the U-shaped frame and a pinion meshing with said sector gear.

24. The apparatus as claimed in claim 13, wherein said wafer boat transferring means comprises a carrier on which said transfer stage is fixedly mounted, a linear guide in front of said array of vertical type dispersing furnaces, and a belt extending around a pair of pulleys, opposite ends of said belt being fixed to said carrier, said belt being reciprocally driven by one of said pulleys such that said transfer stage reciprocatingly moves along said linear guide.

* * * * *